(12) United States Patent
Sugawa et al.

(10) Patent No.: US 7,291,915 B2
(45) Date of Patent: Nov. 6, 2007

(54) CIRCUIT BOARD AND METHOD OF MANUFACTURING THE SAME

(75) Inventors: Toshio Sugawa, Osaka (JP); Hideki Higashitani, Kyoto (JP); Takumi Misaki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 44 days.

(21) Appl. No.: 11/203,124

(22) Filed: Aug. 15, 2005

(65) Prior Publication Data

US 2006/0054350 A1 Mar. 16, 2006

(30) Foreign Application Priority Data

Sep. 13, 2004 (JP) ............... 2004-265105

(51) Int. Cl.
*H01L 23/48* (2006.01)
*H01L 23/52* (2006.01)
*H01L 29/40* (2006.01)

(52) U.S. Cl. ............... 257/737; 257/773; 257/775; 257/780; 257/E23.01

(58) Field of Classification Search ............... 427/97.3, 427/96.1, 97.1, 97.2; 29/846, 830, 831, 836, 29/837; 257/678, 690, 782, 784, 737–739, 257/779, 780, 786, E23.02, E23.037, E23.015, 257/773–775, 778, E23.01, E23.011, E23.019; 174/250, 260–262, 267
See application file for complete search history.

(56) References Cited

U.S. PATENT DOCUMENTS

| | | | | |
|---|---|---|---|---|
| 4,442,137 A | * | 4/1984 | Kumar | 427/560 |
| 4,700,473 A | * | 10/1987 | Freyman et al. | 29/846 |
| 6,365,843 B1 | * | 4/2002 | Shirai et al. | 174/262 |
| 6,434,818 B2 | * | 8/2002 | Kanechika et al. | 29/846 |
| 6,436,735 B1 | * | 8/2002 | Goetz et al. | 438/125 |
| 2004/0099961 A1 | * | 5/2004 | Chu et al. | 257/781 |

FOREIGN PATENT DOCUMENTS

JP 2004-095983 A 3/2004

* cited by examiner

*Primary Examiner*—Fernando L. Toledo
*Assistant Examiner*—Quovaunda Jefferson
(74) *Attorney, Agent, or Firm*—McDermott Will & Emery LLP (57) ABSTRACT

A circuit board includes an insulating substrate, a first conductive layer on the insulating substrate, a second conductive layer on the first conductive layer, and a third conductive layer covering the first conductive layer and the second conductive layer. The first conductive layer has a surface provided on the surface of the insulating substrate, and a surface having a width smaller than a width of the above surface. In this circuit board, the conductive layers have small impedances even if a high-frequency signal flows in the conductive layers.

4 Claims, 7 Drawing Sheets

CIRCUIT BOARD AND METHOD OF MANUFACTURING THE SAME

FIELD OF THE INVENTION

The present invention relates to a circuit board including a conductive layer formed on an insulating substrate, and to a method for manufacturing the circuit board.

BACKGROUND OF THE INVENTION

In a conventional semi-additive method of manufacturing a circuit board which includes minute conductive layer, a first thin conductive layer is formed on an insulating substrate, and then a photosensitive resin shaped in a predetermined pattern is provided on the conductive layer. A second conductive layer is formed on a portion of the first conductive layer exposing from the photosensitive resin. After the photosensitive resin on the first conductive layer is removed to allow a portion of the first conductive layer to expose, and the exposing portion is etched off, thus providing the circuit board.

In a method disclosed in Japanese Patent Laid-Open Publication No. 2004-95983, a first metal film is formed on the insulating substrate, and then the metal film is thinned by a chemical polishing treatment to provide a thin base layer. A mask pattern is provided on the base layer, and a portion of the base layer exposing from the mask pattern is electrolytically plated to provide a second metal film. A third metal film is formed on the second metal film by plating. The mask pattern is removed to allow a unnecessary portion of the base layer to expose, and the unnecessary portion is removed, thus providing a circuit pattern including the base layer, the second metal film, and the third metal film. While the removing of the unnecessary portion of the base layer, the second metal film protects a portion of the base layer between the substrate and the second metal film, and prevents the base layer from being removed from the substrate.

In the circuit boards including fine conductor patterns manufactured by the above methods, however, the conductor patterns may have large impedances for high-frequency signals.

SUMMARY OF THE INVENTION

A circuit board includes an insulating substrate, a first conductive layer on the insulating substrate, a second conductive layer on the first conductive layer, and a third conductive layer covering the first conductive layer and the second conductive layer. The first conductive layer has a surface provided on the surface of the insulating substrate, and a surface having a width smaller than a width of the above surface.

In this circuit board, the conductive layers have small impedances even if a high-frequency signal flows in the conductive layers.

DESCRIPTION OF THE PREFERRED EMBODIMENTS

Exemplary Embodiment 1

FIGS. 1 to 6 are cross sectional views of a circuit board for illustrating processes of manufacturing the circuit board according to Exemplary Embodiment 1 of the present invention.

Figure 1:
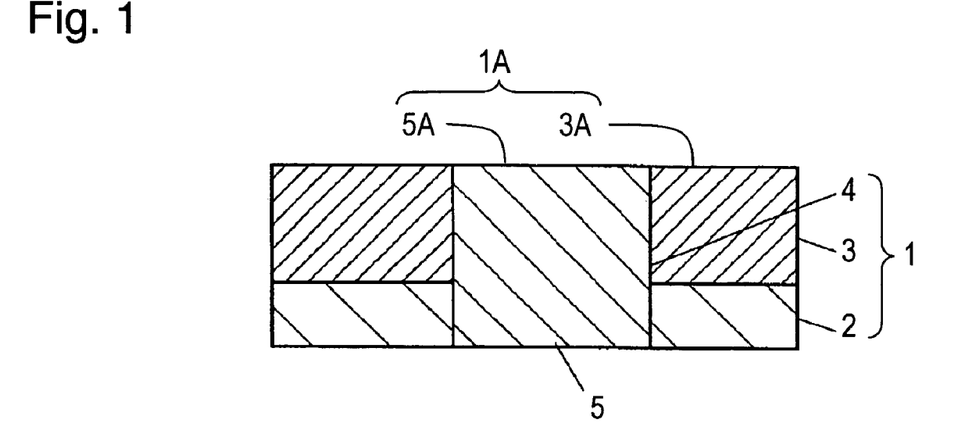
FIG. 1 is a cross sectional view of a circuit board for illustrating a method of manufacturing the circuit board according to Exemplary Embodiment 1 of the present invention.

FIG. 1 is a cross sectional view of insulating substrate 1 having through hole 4 filled with conductive material 5. Fiber sheet 2 of glass cloth (glass fabric) woven with insulating fiber, such as aramid resin fiber or glass fiber has both surfaces each impregnated with epoxy resin to provide resin layer 3 having a thickness ranging, for example, from 5 μm to 20 μm. Insulating substrate 1, or a glass epoxy substrate, is thus provided. Through-hole 4 is formed in insulating substrate 1 by optical process, such as $CO_2$ gas laser, or a mechanical drill. Through-hole 4 is filled with a paste of electro conductive material 5 provided by mixing 30-80 vol. % of copper grains having diameters of 1 μm to 50 μm in a resin material for a 30-80 capacitive %, by printing process or injection.

Lateral and longitudinal dimensions of fiber sheet 2 (glass cloth) varies due to environmental factors, such as a temperature, depending on physical properties of the glass fiber, such as a thermal expansion coefficient. Fiber sheet 2 made of the glass fiber having known physical properties has the dimensions allows the position of a conductor pattern and a position relative to another conductor pattern to be easily determined. Insulating substrate 1 may be made of other materials, such as ceramic film or resin film.

30 to 90 vol. % of grains of insulating material, such as glass or alumina, having diameters ranging from 1 μm to 100 μm diameter are mixed in resin layer 3, and prevent copper grains of conductive material 5 from moving into resin layer 3 due to a pressure applied at a later pressing process.

Figure 2:
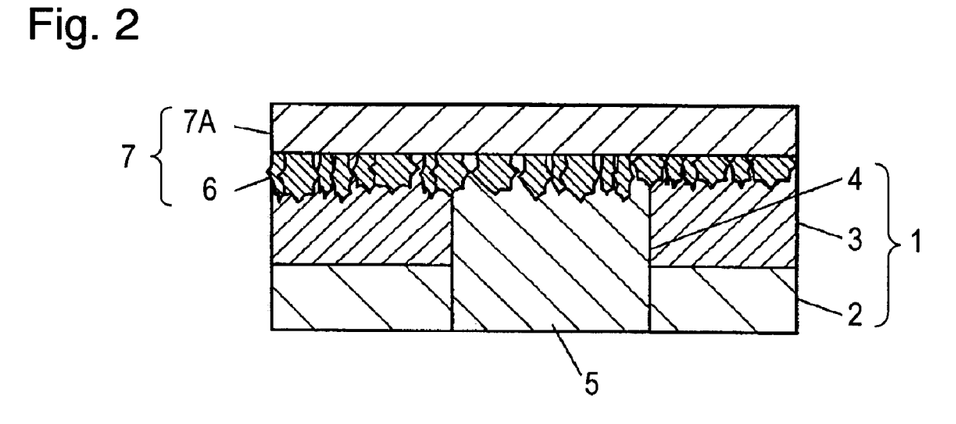
FIG. 2 is a cross sectional view of the circuit board for illustrating the method of manufacturing the circuit board according to Embodiment 1.

As shown in FIG. 2, conductive layer 7 of metal, such as copper, is attached onto surface 1A of substrate 1, i.e., onto resin layer 3 and conductive material 5, by vacuum-heat pressing. Conductive layer 7 includes dense solid layer 7A and rough layer 6 rougher than solid layer 7A. In other words, conductive layer 7 has dense upper surface 7B (upper surface 7B of solid layer 7A) and lower surface 7F (rough layer 6) rougher than upper surface 7B. As shown in FIG. 2, rough layer 6 is put into surface 1A of insulating substrate 1, that is, into surface 3A of resin layer 3 and surface 5A of conductive material 5. In order to provide a double-side circuit board including conductor patterns on both surfaces of insulating substrate 1 having through hole 4 therein filled with conductive material 5, conductive layer 7 including rough layer 6 may be placed on each of both surfaces of insulating substrate 1 and heated/pressed in vacuum.

This vacuum heat pressing eliminates gas, such as air, remaining at an interface between rough layer 6 and conductive material 5 and between rough layer 6 and resin layer 3. A temperature during the vacuum heat pressing may range from 100° C. to 260° C. In the case that the vacuum heat pressing is performed again at a later stage, the first pressing is performed at a temperature of approximately 120° C., which is lower than a glass transition temperature of epoxy resin, and then performed at a temperature of approximately 240° C., which is higher than the glass transition temperature, for completely curing the epoxy resin.

Since conductive material 5 in through-hole 4 is compressed during the vacuum heat pressing, rough layer 6 of conductive layer 7 is attached tightly with conductive material 5. A roughness of rough layer 6 increases an area of layer 6 contacting conductive material 5. This structure reduces an electrical contact resistance between conductive material 5 and conductive layer 7. Furthermore, rough layer 6 biting into resin layer 3 prevents conductive layer 7 from being removed from resin layer 3.

The above effects become greater according to an increase of the roughness at rough layer 6, and the roughness of the rough layer may range preferably from 1 μm to 10 μm. The roughness exceeding 10 μm causes a large area of a side surface of rough layer 6 to be side-etched at a later etching process, and thins a conductor pattern having its shape deforming, thus hardly providing a fine conductor pattern.

The thickness of conductive layer 7 may ranges preferably from 0.5 μm to 5 μm. During the etching of conductive layer 7 having a metal layer plated thereon, conductive layer 7 (rough layer 6) is not etched at the interface between insulating substrate 1 and rough layer 6 as much as other portions, thus providing conductive layer 7 with a preferable shape.

In a multi-layer circuit board having an internal via hole (IVH) in plural insulating layers, the above-configured structure provides a connection between the layers at any position regardless of the positions of through-holes formed in other layers, and allows a component to be mounted on any position particularly of the outermost layers.

Figure 3:
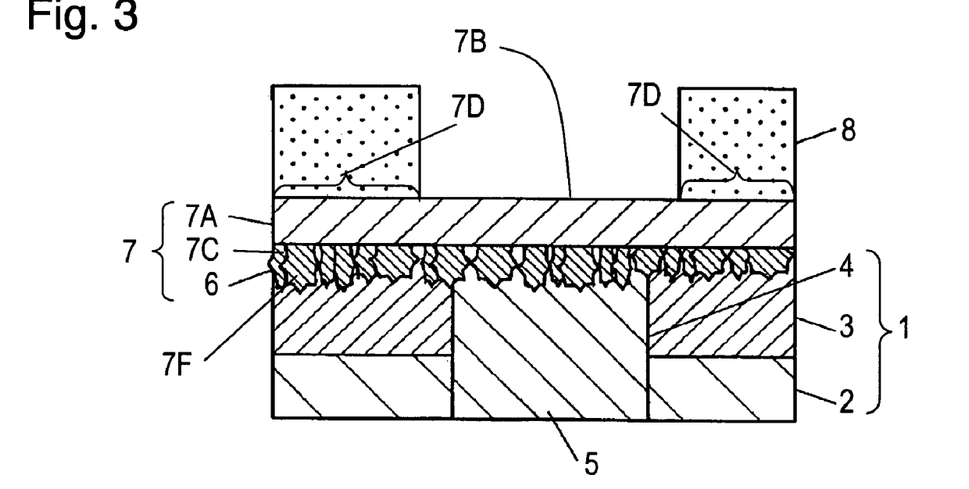
FIG. 3 is a cross sectional view of the circuit board for illustrating the method of manufacturing the circuit board according to Embodiment 1.

Then, mask 8 made of photosensitive resin is provided on region 7D of upper surface 7B of solid layer 7A of conductive layer 7, as shown in FIG. 3. A conductor pattern is not provided on region 7D. A dry film resist of photosensitive resin is heat-pressed onto upper surface 7B of conductive layer 7 and then light-exposed via a photo mask to develop the resist, thus easily providing mask 8. Alternately, liquid resist is spin-coated or roll-coated on upper surface 7B of conductive layer 7 and then light-exposed via a photo mask to develop the resist, thus easily providing mask 8.

Mask 8 can have dimensions identical to those of the photo mask within an allowance less than 1 μm. The liquid resist can provide thinner mask 8 than the dry film resist, thereby providing a definition ranging from 1 μm to 10 μm. Mask 8, being thinner than a layer formed by plating at a later plating process, can be removed easily after the plating process.

Figure 4:
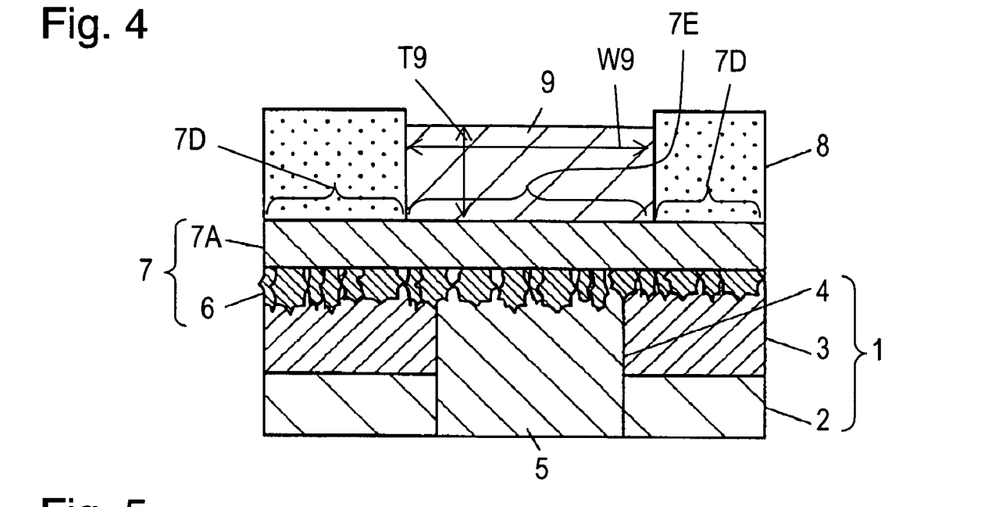
FIG. 4 is a cross sectional view of the circuit board for illustrating the method of manufacturing the circuit board according to Embodiment 1.

As shown in FIG. 4, conductive layer 9 is formed by electro-plating on region 7E of upper surface 7B of conductive layer 7 which is not covered with mask 8. Conductive layer 9 is made of the same copper material as conductive layer 7. Conductive layer 9 is electro-plated in plating solution essentially containing copper sulfate solution with brightener, and thereby, has even and flat thickness T9 regardless of width W9. A plating current density is determined to be lower than 10 A/dm$^2$, preferably to range from 1 A/dm$^2$ to 6 A/dm$^2$, thereby allowing conductive layer 9 to be dense and to have even thickness T9. The size and the density of crystal grains of conductive layer 9 generally change according to the current density. The lower the current density, the higher is the crystal grain density. The high density provides dense conductive layer 9. The smaller an etching speed is, the denser the crystal grains are. Therefore, the grain size is preferably small.

Figure 5:
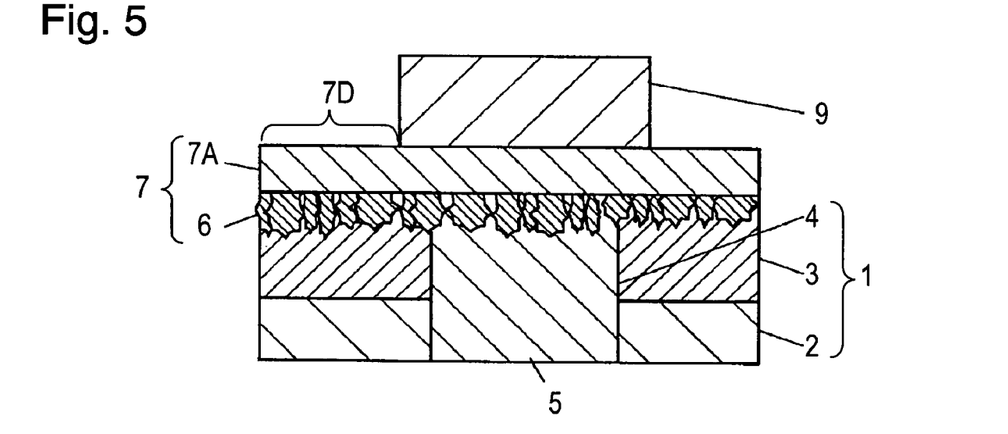
FIG. 5 is a cross sectional view of the circuit board for illustrating the method of manufacturing the circuit board according to Embodiment 1.

Then, as shown in FIG. 5, mask 8 is removed, thus allowing region 7D of upper surface of conductive layer 7 to expose.

Figure 6:
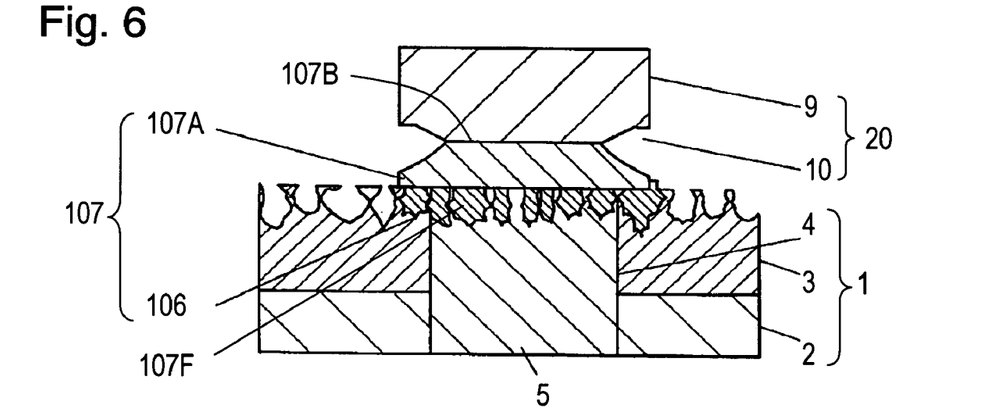
FIG. 6 is a cross sectional view of the circuit board for illustrating the method of manufacturing the circuit board according to Embodiment 1.

Then, a portion of solid layer 7A of conductive layer 7 and a portion of rough layer 6 under region 7D is removed by etching, as shown in FIG. 6, to provide solid layer 107A and rough layer 106 which remain, thus providing predetermined conductor pattern 20 with conductive layer 9. Conductive layer 9 may be covered with a masking layer withstanding to etching liquid before the etching. The masking layer can be formed either by using a solder or by continuous electroplating, depositing or spattering tin, nickel, or, aluminum, to have a thickness not thicker than 1 μm. Since the masking layer covers a surface and an edge of conductive layer 9, hence preventing conductive layer 9 from deforming.

Conductive layer 107 including rough layer 6 is etched from its surface and has a trapezoidal cross section in which a width of upper surface 107B contacting conductive layer 9 is smaller than a width of lower surface 107F (rough layer 106). The trapezoidal cross section has side walls concave along an arc.

A boundary plane is provided at the interface between conductive layer 7 and conductive layer 9 due to an interposing layer of micro contamination or natural oxide film existing before the electroplating process, or a discontinuity of metallic crystallization. During the etching, conductive layer 9 is etched along the interface between conductive layer 7 and conductive layer 9 as well. This provides constricted portion 10 at the interface between conductive layer 7 and conductive layer 9, as shown in FIG. 6. Constricted portion 10 increases a surface area of the conductor pattern formed of conductive layers 107 and 9. This structure reduces the impedance of the conductor pattern at high frequencies higher than 100 MHz in which a skin effect appears, and prevents a possible delay in the signal propagation. The shape of constricted portion 10 may be changed according to the size and density of crystal grains of conductive layers 7 and 9. The size and density of the crystal grains can be controlled with the formation conditions of conductive layers 7 and 9, thus allowing the shape of constricted portion 10 to be controlled.

Figure 7:
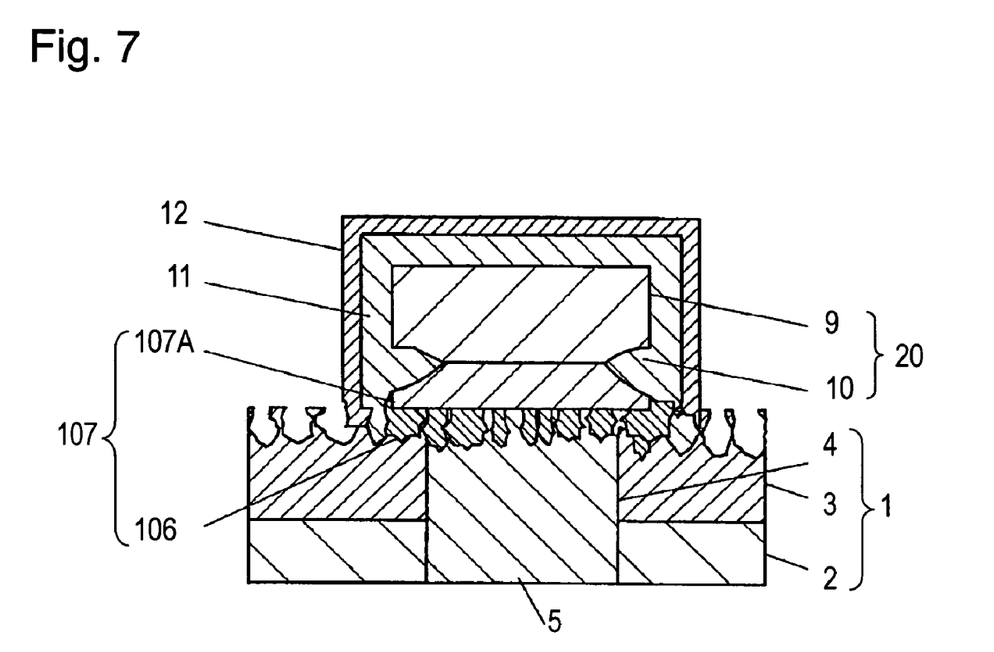
FIG. 7 is a cross sectional view of the circuit board for illustrating the method of manufacturing the circuit board according to Embodiment 1.

Then, as shown in FIG. 7, conductive layer 11 is formed by electroless plating process to cover the surfaces of conductive layer 107 and conductive layer 9. Conductive layer 11 made of nickel has a thickness ranging from 1 μm to 10 μm, preferably from 2 μm to 7 μm. Conductive layer 11 covers constricted portion 10 formed at the interface between conductive layer 107 and conductive layer 9. Conductive layer 11 is attached securely onto both of the surfaces of conductive layer 107 and conductive layer 9, thereby preventing conductive layer 107 from being removed from conductive layer 9 at the interface. In order to provide a high mounting reliability of component devices or semiconductor devices, conductive layer 11 formed of nickel may be continuously covered with conductive layer 12 made of gold by electroless plating.

A unwoven fabric made with resin fibers, such as aramid resin, may have a shape of paper instead for fiber sheet 2 of insulating substrate 1. Since an epoxy-impregnated unwoven fabric shrinks with a pressing force, conductive material 5 is compressed further during the pressing, and copper grains in conductive material 5 strongly contact each other, providing conductive material 5 with a small resistance. Since through-hole 4 is surrounded with dense fibers, the copper grains in conductive material 5 filling through-hole 4 are prevented from flowing out. Thus, conductive layer 7 is electrically connected to conductive material 5 in through hole 4 reliably.

Insulating substrate 1 may employ a film of polyimide or liquid crystal polymer, and can have a thickness smaller than 70 μm and allow through-hole 4 to be formed easily by YAG laser.

Rough layer 6 of conductive layer 7 can be provided by first forming an even metal film on a rigid plate made of, e.g. resin or metal by deposition or plating, and then by producing grains on the metal film by abnormal electroplating caused by a large current. Rough layer 6 may be provided instead by spraying molten metal onto the metal film. Conductive layer 7 including rough layer 6 on the rigid plate are vacuum heat pressed onto substrate 1, and then the rigid plate is removed mechanically or by etching to transfer conductive layer 7.

Alternately, conductive layer 7 can be formed on substrate 1 by the following methods. A thick copper foil having a thickness ranging from 12 μm to 18 μm which has rough layer 6 thereon, and then, the foil is etched to have a predetermined thickness with using, for example, etching solution which contains mixture of sulfuric acid and hydrogen peroxide as main ingredient. Or, a copper foil having a thickness of approximately 2 μm on another metal foil, such as aluminum foil, and then, rough layer 6 is formed on a surface by plating. Or, a copper foil having a thickness ranging from 3 μm to 5 μm having rough layer 6 thereon may be attached onto another copper foil (carrier) for reinforcing the layer.

In a conventional circuit board manufactured by a conventional semi-additive method, a first conductive layer is formed to be as thin as possible to have a thickness of 0.5 μm. Upon being etched, a portion of the first conductive layer contacting a insulating substrate is largely etched by a side-etching in which a side surface of the conductive layer is etched. This may allow the first conductive layer from being removed from the insulating substrate.

A conventional circuit board manufactured by a method disclosed in Japanese Patent Laid-Open Publication No. 2004-95983 requires a plating process for forming a second metal film. There is the difference of potentials of metal material of a first metal film providing a base layer and metal material of the second metal film. The difference may facilitate a side-etching according to a combination of the metal materials, and provide an oxide layer on the second metal film instantly, thus preventing a third metal film from being provided no the second metal film.

In circuit board according to Embodiment 1, insulating substrate 1 is connected securely with conductive layer 7 firmly without a gap between them. Consequently, the conductor pattern is attached securely to substrate 1, thus not causing the problems of the conventional methods. Furthermore, since surface 5A of conductive material 5 provided in through-hole 4 is covered with the conductor pattern, a component device can be mounted on a place corresponding to through-hole 4. This structure allows the surface area of substrate 1 to be utilized.

Exemplary Embodiment 2

FIGS. 8 to 15 are cross sectional views of a circuit board for illustrating a method of manufacturing the circuit board according to Exemplary Embodiment 2 of the present invention. Portions identical to those of Embodiment 1 are denoted by the same reference numerals, and description of the portions is eliminated.

Figure 8:
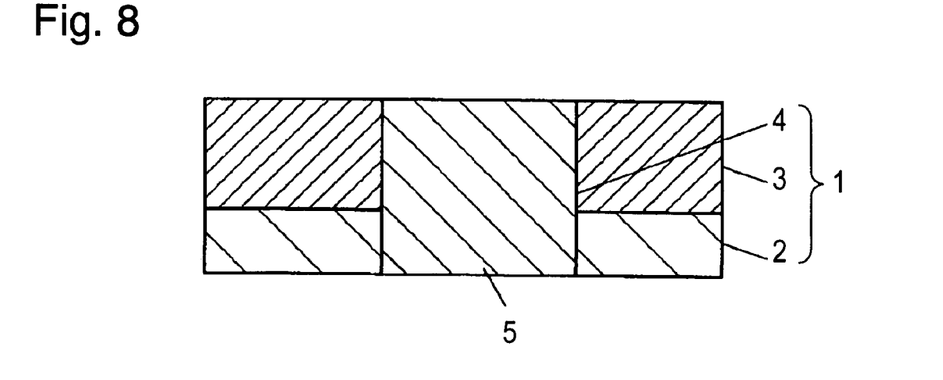
FIG. 8 is a cross sectional view of a circuit board for illustrating a method of manufacturing the circuit board according to Exemplary Embodiment 2 of the invention.

First, as shown in FIG. 8, insulating substrate 1 formed by the same method as of the Embodiment 1 is provided with through-hole 4 by an optical method, such as $CO_2$ gas laser or by a mechanical method, such as drilling. Through-hole 4 is filled with paste of electrical conductive material 5. Conductive material is provided by mixing 30 to 80 vol. % of copper grains having diameters ranging from 1 μm to 50 μm in resin material. The paste can be dispensed by printing process or jet nozzle injection.

Figure 9:
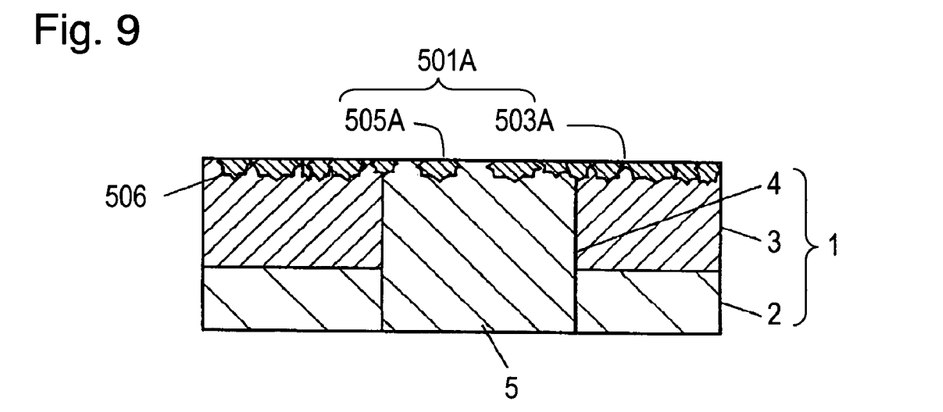
FIG. 9 is a cross sectional view of the circuit board for illustrating the method of manufacturing the circuit board according to Embodiment 2.

As shown in FIG. 9, rough layer 506 is provided on surface of 501A of insulating substrate 1 by applying a roughening process, i.e., on surface 505A of conductive material 5 and surface 503A of resin layer 3. Rough layer 506 may be provided by erosion with alkaline liquid, or by transferring a rough surface of a replica. In rough layer 506, conductive grains contained in conductive material 5 filling through-hole 4 expose.

Figure 10:
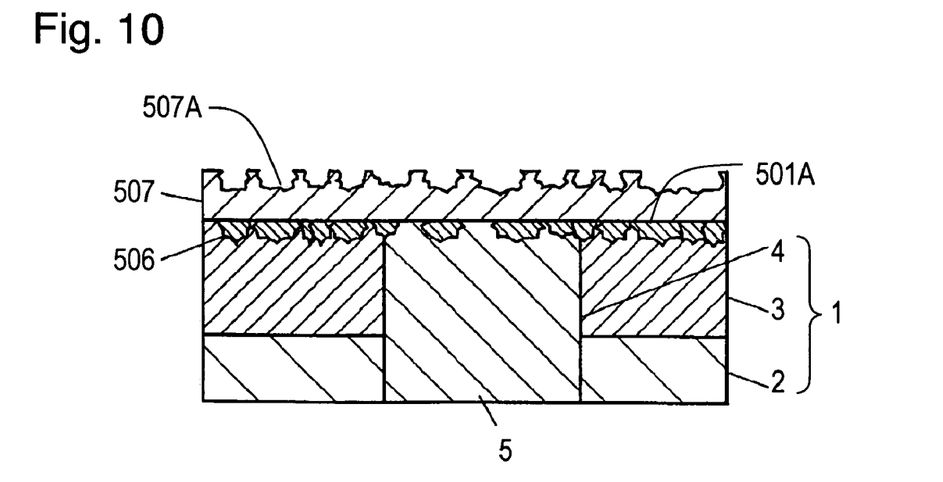
FIG. 10 is a cross sectional view of the circuit board for illustrating the method of manufacturing the circuit board according to Embodiment 2.

As shown in FIG. 10, conductive layer 507 is provided on rough layer 506 of surface 501A of insulating substrate 1 by electroless plating of copper or other metal. Conductive layer 507 is thicker than the roughness of rough layer 506 and is thick enough not to side-etched in later etching process. Practically, layer 507 may have a thickness ranging preferably from 0.5 μm to 3 μm. Conductive layer 507 can be formed evenly on substrate 1 by an electroless plating method, and therefore, can be etched stably at the later process. Upper surface 507A of conductive layer 507 has been roughened.

Figure 11:
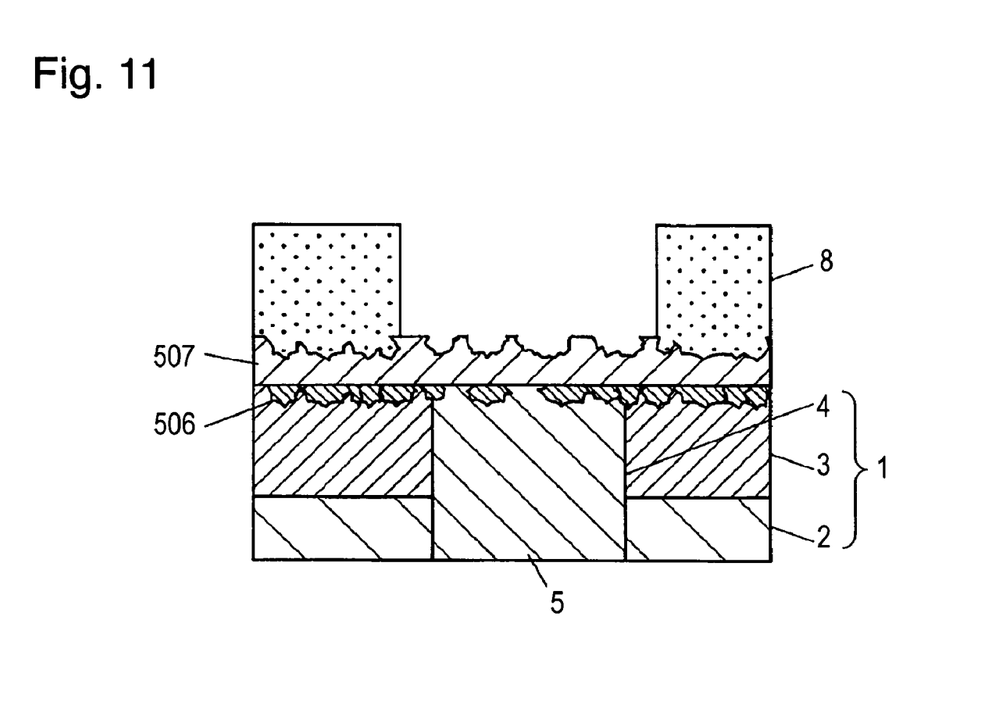
FIG. 11 is a cross sectional view of the circuit board for illustrating the method of manufacturing the circuit board according to Embodiment 2.

As shown in FIG. 11, mask 8 of photosensitive resin is provided on upper surface 507A of conductive layer 507 to cover a region on which no conductor pattern is to be formed.

Figure 12:
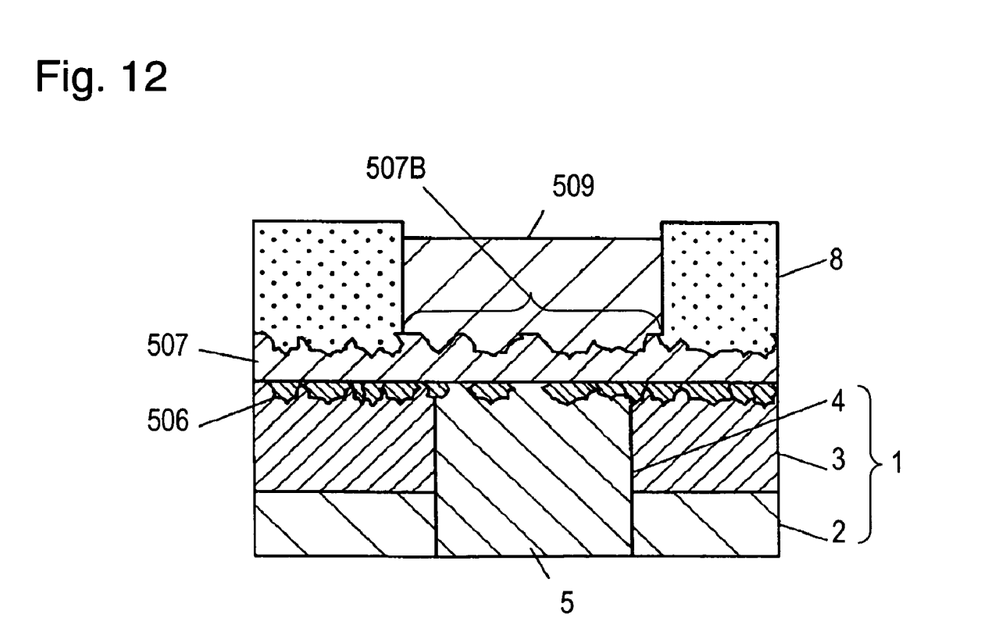
FIG. 12 is a cross sectional view of the circuit board for illustrating the method of manufacturing the circuit board according to Embodiment 2.

As shown in FIG. 12, conductive layer 509 is provided, by electroplating copper material, i.e., the same metal as conductive layer 507, on portion 507B of conductive layer 507 exposing from mask 8. Sizes of crystal copper grains and other factors influencing to an etching speed can be changed by controlling a current density or other formation conditions of the electroplating. Since upper surface 507A of conductive layer 507 is roughened, conductive layer 509 is connected securely onto conductive layer 507.

Figure 13:
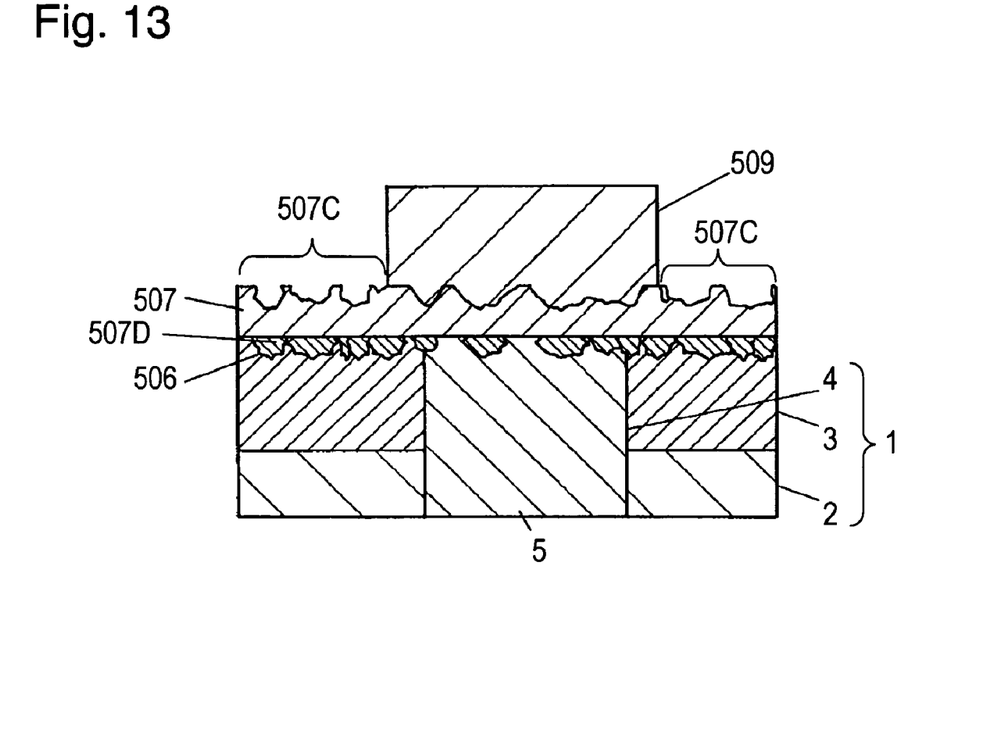
FIG. 13 is a cross sectional view of the circuit board for illustrating the method of manufacturing the circuit board according to Embodiment 2.
Figure 14:
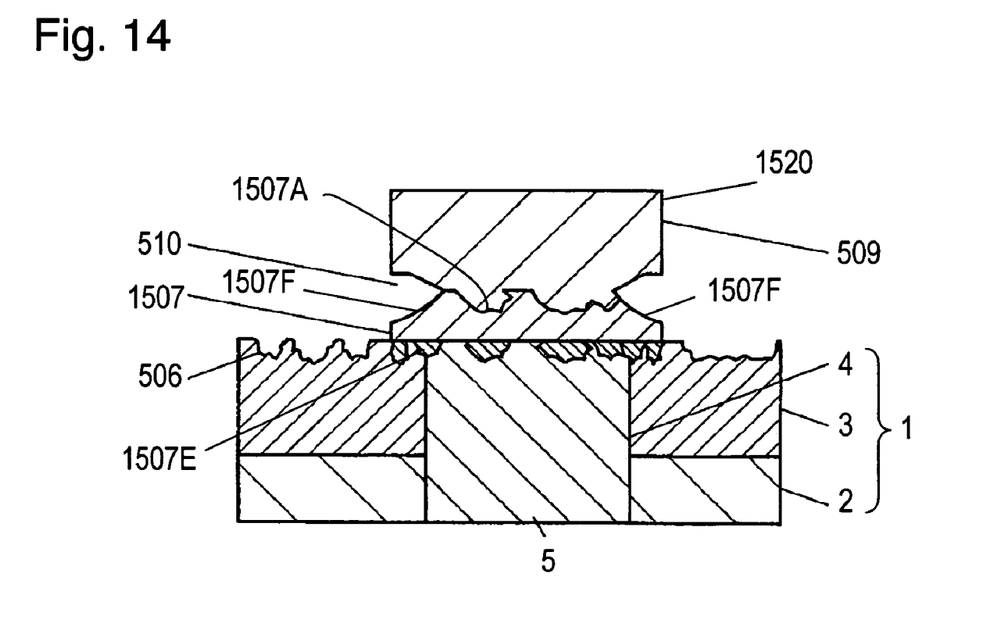
FIG. 14 is a cross sectional view of the circuit board for illustrating the method of manufacturing the circuit board according to Embodiment 2.

As shown in FIG. 13, mask 8 is removed to allow portion 507C of surface 507A of conductive layer 507 to expose. Then, as shown in FIG. 14, exposing portion 507C of conductive layer 507 and portion 507D intruding into rough layer 506 are removed to obtain predetermined conductor pattern 1520 (FIG. 14) including conductive layers 507 and 509. If conductive layer 507 is thin, conductive layer 507 may be etched at the interface between conductive layer 507 and insulating substrate 1, namely, the side etching may be expedited. However, if conductive layer 507 is provided by electroless plating, the layer may have a thickness preventing the layer from the side etching. Therefore, a gap is not produced at the interface between upper surface 501A of insulating substrate 1 and conductive layer 507.

In the etching, conductive layer 507 is etched from upper surface 507A. This etching provides conductive layer 1507 having portion 507D intruding into rough layer 506 and a trapezoidal cross section, as shown in FIG. 14. Bottom surface 1507E of conductive layer 1507 contacting substrate 1 is larger than upper surface 1507A, and the trapezoidal shape has side walls concave like arcs. Conductive layer 1507 and conductive layer 509 are etched along the interface between conductive layer 1507 and conductive layer 509, thus providing constricted portion 510. Constricted portion 510 increases a large surface area of the conductor pattern including conductive layers 1507 and 509. Similarly to constricted portion 10 of Embodiment 1, the conductor pattern has a small impedance at high frequencies.

Figure 15:
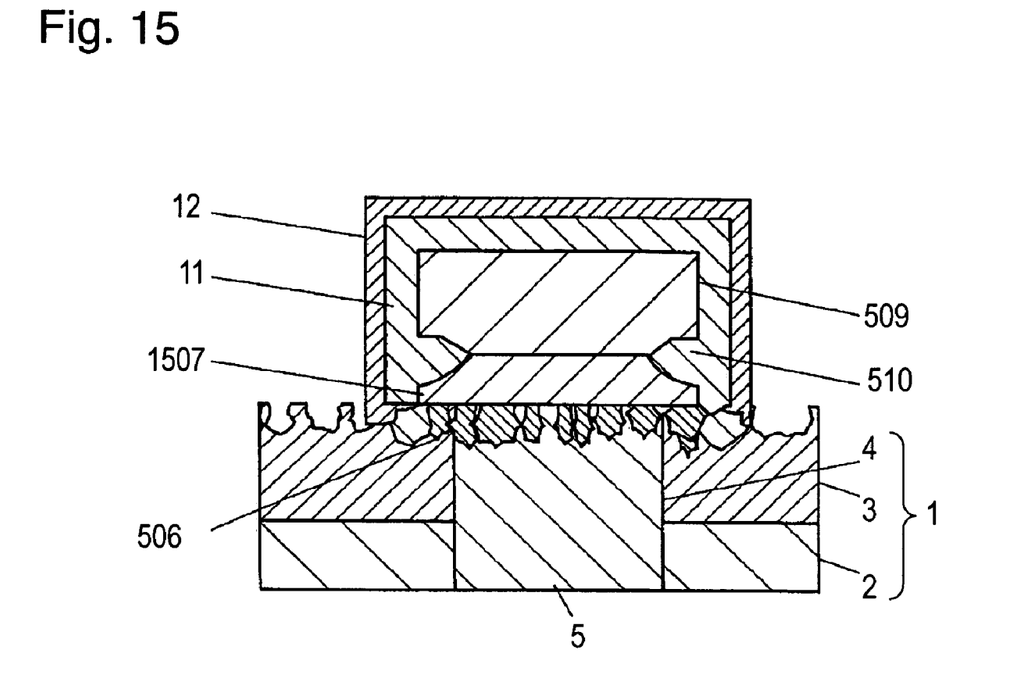
FIG. 15 is a cross sectional view of the circuit board for illustrating the method of manufacturing the circuit board according to Embodiment 2.

Then, as shown in FIG. 15, conductive layer 11 having a thickness ranging from 1 μm to 10 μm, preferably from 2 μm to 7 μm, is provided by electroless plating of nickel to cover surfaces of conductive layer 1507 and conductive layer 509. Conductive layer 11 covers constricted portion 510 provided at the interface between conductive layer 1507 and conductive layer 509. Since conductive layer 11 is attached securely onto surfaces of conductive layer 1507 and conductive layer 509, layer 11 prevents conductive layer 1507 from being removed from conductive layer 509 at the interface. Conductive layer 12 of gold is provided by electroless-plating continuously to conductive layer 11 of nickel.

According to Embodiment 2, an adhesive strength between conductive layer 507 and substrate 1 can be controlled by adjusting the roughness of rough layer 506 during roughening treatment performed for the surface of insulating substrate 1. Furthermore, the shape of constricted portion 510 formed at the interface between conductive layer 1507 and conductive layer 509 can be controlled by changing a speed of the etching of conductive layers 1507 and 509. Thus, a circuit board including fine conductor pattern 1520 and having superior high frequency characteristics is provided. Since the electroless plating method forms conductive layer 507 evenly on rough layer 506 of substrate 1, conductive layer 507 can be etched stably.

What is claimed is:

1. A circuit board, comprising:
   an insulating substrate having a surface;
   a first conductive layer having a first surface and a second surface opposite to the first surface, the first surface being provided on the surface of the insulating substrate, the second surface having a width smaller than a width of the first surface;
   a second conductive layer having a first surface and a second surface opposite to the first surface, the first surface of the second conductive layer provided on the second surface of the first conductive layer;
   an interface formed between the second surface of the first conductive layer and the first surface of the second conductive layer;
   a constricted portion is formed at the interface; and
   a third conductive layer covering the first conductive layer, the second conductive layer, and the constricted portion,
   wherein a width of the second surface of the second conductive layer is larger than the width of the second surface of the first conductive layer.

2. The circuit board of claim 1, wherein the insulating substrate is provided with a hole in a portion of the surface contacting the first conductive layer, and wherein the aperture is filled with a conductive material connected with the first conductive layer.

3. The circuit board of claim 1, wherein the first surface of the first conductive layer is roughened.

4. The circuit board of claim 1, wherein the second surface of the first conductive layer is roughened.

* * * * *